(12) United States Patent
Kashiwakura

(10) Patent No.: US 7,446,624 B2
(45) Date of Patent: Nov. 4, 2008

(54) TRANSMISSION LINE AND WIRING FORMING METHOD

(75) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 323 days.

(21) Appl. No.: 11/365,921

(22) Filed: Mar. 2, 2006

(65) Prior Publication Data
US 2006/0197625 A1    Sep. 7, 2006

(30) Foreign Application Priority Data
Mar. 3, 2005    (JP) .............................. 2005-059017

(51) Int. Cl.
*H03H 7/38*    (2006.01)
(52) U.S. Cl. .............................. 333/34; 333/4; 333/238
(58) Field of Classification Search .................... 333/34, 333/33, 238, 246, 4, 5, 236
See application file for complete search history.

(56) References Cited

U.S. PATENT DOCUMENTS 6,501,352 B1 * 12/2002 Koriyama et al. ........... 333/260
6,677,831 B1 * 1/2004 Cheng et al. ................... 333/34

FOREIGN PATENT DOCUMENTS

JP    4-367258    12/1992
JP    2003-163510    6/2003

OTHER PUBLICATIONS

Kazuhiro Kashiwakura et al. "High Speed Transmission Technology for IP Switch Router" NEC Gihou vol. 55, No. 10, pp. 55-58.

* cited by examiner

*Primary Examiner*—Stephen E Jones
(74) *Attorney, Agent, or Firm*—Dickstein Shapiro LLP

(57) ABSTRACT

To provide a transmission line capable of absorbing the reflection caused by mismatching between impedances and restraining the attenuation value of a signal. The following wiring patterns are formed out of a connector mounting area in which a connector is mounted: a wiring pattern designed so as to gradually increase the wiring width and the interval between wirings of a wiring portion (B) and gradually decrease the characteristic impedance of the wiring portion (B) and a wiring pattern designed so as to gradually decrease the wiring width and the interval between wirings of the wiring portion (B') and gradually amplify the characteristic impedance of the wiring portion (B').

21 Claims, 9 Drawing Sheets

F I G. 4
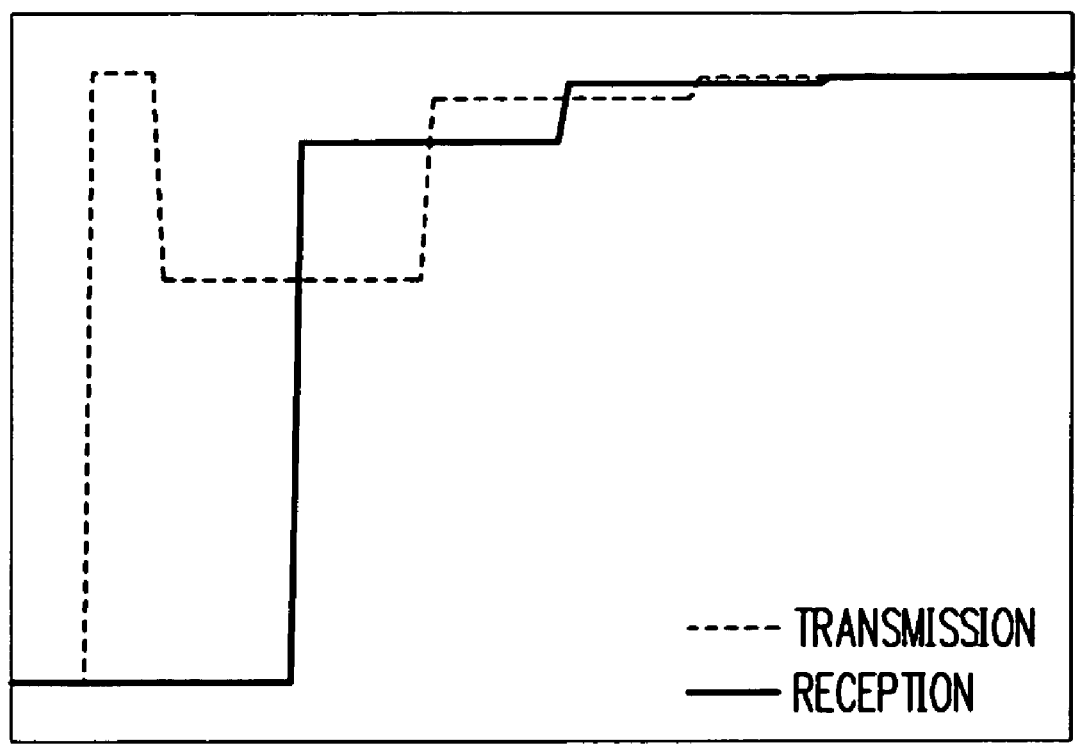
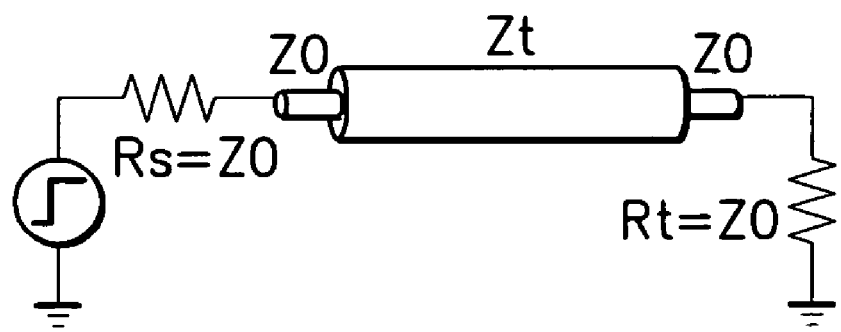

FIG. 5
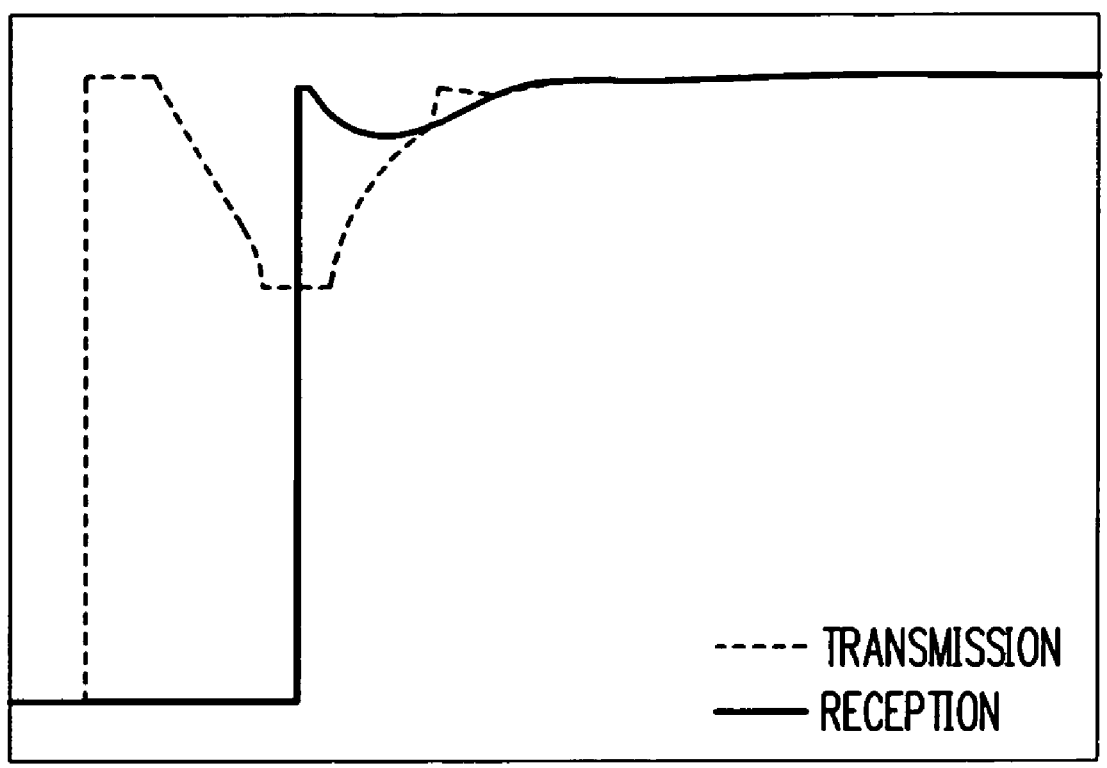
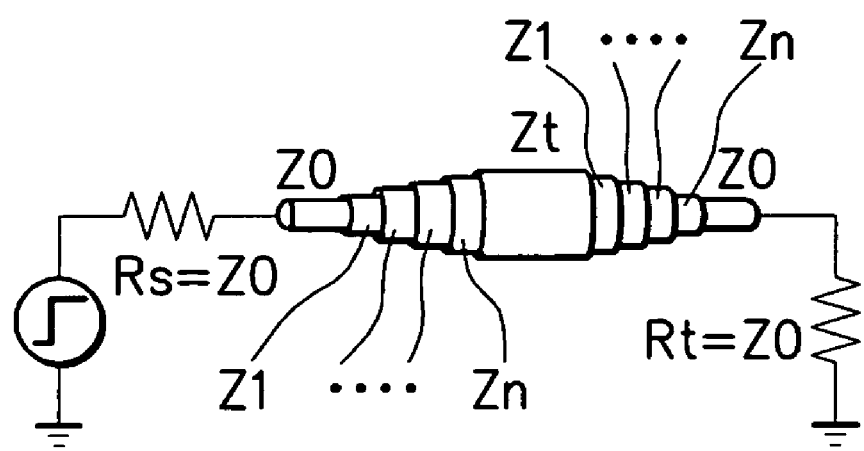

TRANSMISSION LINE AND WIRING FORMING METHOD

BACKGROUND OF THE INVENTION

The present invention relates to a transmission line applicable to a high-speed backplane transmission and a wiring forming method for forming the wiring of the transmission line.

DESCRIPTION OF RELATED ART

Data quantity flowing through an IP network increases year by year because of rapid spread of the Internet. To process the enormous data quantity, high-speed signal processing is performed in an IP switch router. A schematic configuration of the IP switch router is described by referring to FIG. 1.

As shown in FIG. 1, a circuit card (1) and switch card (2) are housed in the housing of an IP switch and they are electrically connected through a backplane (3).

An external circuit signal enters the circuit card (1) in the form of light or electricity, routes are changed by the switch card (2), and a circuit signal is transferred to the outside from another circuit card.

Because in the IP switch router a signal is transferred between the circuit card (1) and the switch card (2) through the backplane (3), it is necessary to perform higher-speed backplane transmission as the circuit speed increases.

Backplane transmission using a communication unit or server is becoming faster more concentrated and connector terminals for connecting a backplane are also increasing their density. To connect a wiring to the high-density connector terminals, a wiring width should be decreased and there arises a problem that the wiring width cannot be increased. FIG. 2 shows attenuation values of a signal according to a difference between wiring width. The axis of abscissa shows frequency and the axis of ordinate shows attenuation value.

As clarified from the measurement results in FIG. 2, it is shown that a wiring width 0.24 mm has the attenuation value of a signal smaller than the case of a wiring width 0.12 mm. Therefore, as shown in FIG. 2, as a wiring width decreases, the attenuation value of a signal increases and thus it becomes difficult to perform long-distance transmission.

In the case of high-speed transmission exceeding GHz, a problem that a signal is attenuated due to dielectric loss and conductor loss of a wiring pattern is generally known. It is possible to improve the dielectric loss by decreasing the loss of a printed circuit board and the conductor loss by increasing the wiring width of a wiring pattern constituting a transmission line. Therefore, to perform long-distance transmission, a wiring width is designed as widely as possible in order to restrain the attenuation value of a signal.

As related art, Japanese Patent Application Laid-Open No. 2003-163510 (Patent document 1) discloses a transmission line in which a tapered central conductor and two grounds are formed at both ends of the central conductor across a gap, and in which the border of the tapered part of the central conductor is formed into a differential curve, reflection of a high-frequency signal at the tapered portion is decreased, and the characteristic impedance remains constant.

Japanese Patent Application Laid-Open No. 4-367258 (Patent Document 2) discloses a semiconductor chip and a transmission line, the transmission line comprising a first portion electrically connected with the chip, a second portion larger than the first portion for outputting a signal to the outside, and a tapered portion formed between the first and the second portion so that reflection caused by mismatching of the characteristic impedance in a semiconductor package is decreased.

Furthermore, "High-speed transmission technique of IP switch router" (Kazuhiro Kashiwakura et al., NEC Gihou Vol. 55, No. 10, pp. 55-58) (Non-Patent document 1) discloses the transmission line design of a printed circuit board for high-speed transmission.

In the invention of Patent Document 1, it is assumed that impedance is fixed all over the transmission line. This invention neither deals with impedance mismatching nor mentions smoothing a change of impedance.

The invention of the above Patent Document 2 absorbs the mismatching between characteristic impedances at an impedance gradient but the attenuation characteristic of a signal in a transmission line is not considered.

SUMMARY OF THE INVENTION

The present invention is made in view of the above situation and its object is to provide a transmission line and a wiring forming method capable of absorbing reflection caused by mismatching between impedances and restraining the attenuation value of a signal.

To achieve the above object, the present invention has the following features.

A transmission line of the present invention comprises a plurality of tapered lines which are designed, outside a wiring area where space for wiring is difficult to secure, so that a line width and a line interval are gradually increased and characteristic impedances of the lines are gradually decreased, and the lines are also designed so that the line width and the line interval are gradually decreased and characteristic impedances of the lines are gradually increased.

The transmission line's width may be decreased and its characteristic impedance may be adjusted to a predetermined value in a wiring area where space for wiring is difficult to secure.

The transmission line's width may be broadened in a wiring area where space for wiring is easily secured.

The transmission line's characteristic impedance may be gradually decreased from a wiring in an area where space for wiring is difficult to secure to a wiring in a wiring area where space for wiring is easily secured, and the characteristic impedance may be gradually increased from the wiring in the wiring area where space for wiring is easily secured to the wiring in the wiring area where space for wiring is difficult to secure.

The transmission line's characteristic impedance may be gradually decreased at the input terminal side, and the characteristic impedance may be gradually increased at the output terminal side.

The transmission line may be designed so that the electromagnetic connection between the lines becomes weak.

Connectors may be set in a wiring area where space for wiring is difficult to secure.

A differential signal line may be formed by such a wiring design.

The transmission line may be a microstrip line, comprising a GND layer, an insulating layer formed on the GND layer, and a wiring layer on which the wiring is formed where the wiring layer is formed on the insulating layer.

The transmission line may be a strip line, comprising a GND layer, an insulating layer formed on the GND layer, and a wiring layer on which the wiring is formed where the wiring layer is embedded in the insulating layer.

The transmission line's the characteristic impedance may be optimized in accordance with a line width, a line interval, a thickness of the wiring layer, a thickness of the insulating layer, and relative dielectric constant of the insulating layer.

In a wiring forming method of the present invention, wiring is designed so that a line width and a line interval are gradually increased and the characteristic impedance of the lines is gradually decreased in an area outside a wiring area where space for wiring is difficult to secure, and the wiring is designed so that the line width and the line interval are gradually decreased and the characteristic impedance of the wiring is gradually increased on the printed circuit board.

In accordance with the wiring forming method, on the printed circuit board, a wiring width may be decreased in a wiring area where space for wiring is difficult to secure and the characteristic impedance of the lines may be adjusted to a predetermined value.

In accordance with the wiring forming method, a line width may be increased in a wiring area where space for wiring is easily secured on the printed circuit board.

In accordance with the wiring forming method, characteristic impedance may be gradually decreased from a wiring area where space for wiring is difficult to secure toward a wiring area where space for wiring is easily secured, and the characteristic impedance may be gradually increased from a wiring area where space for wiring is easily secured toward a wiring area where space for wiring is difficult to secure.

In accordance with the wiring forming method, characteristic impedance may be gradually decreased at the input terminal side of the printed circuit board and the characteristic impedance may be gradually increased at the output terminal side of the printed circuit board.

In accordance with the wiring forming method, the wiring may be designed on the printed circuit board so that the electromagnetic connection between lines becomes weak.

In accordance with the wiring forming method, a differential signal line may be formed on the printed circuit board by such a wiring design.

In accordance with the wiring forming method, a microstrip line is formed on the printed circuit board and comprises a GND layer, an insulting layer formed on the GND layer, and a wiring layer on which the wiring is formed where the wiring layer is formed on the insulating layer.

In accordance with the wiring forming method, a strip line is formed on the printed circuit board and comprises a GND layer, an insulating layer formed on the GND layer, and wiring layer on which the wiring is formed where the wiring layer is embedded in the insulating layer.

In accordance with the wiring forming method, the characteristic impedance is optimized in accordance with a line width, a line interval, a thickness of the wiring layer, a thickness of the insulating layer, and relative dielectric constant of the insulating layer on the printed circuit board.

In the case of a transmission line and a wiring forming method of the present invention, a wiring is designed so as to gradually increase a wiring width and a line interval outside a wiring area where space for wiring is difficult to secure and gradually decrease the characteristic impedance, and also designed so as to gradually decrease a wiring width and a line interval and gradually increase the characteristic impedance of the wiring. Thereby, it is possible to absorb the reflection caused by impedance mismatching and restrain the attenuation value of signals.

BRIEF DESCRIPTION OF THE DRAWINGS

The objects and features of the present invention will become more apparent from the consideration of the following detailed description taken in conjunction with the accompanying drawings, in which:

FIG. 4 is a graph showing pulse responses when impedances are mismatched in conventional different-type-of-wiring connection;

FIG. 5 is a graph showing a pulse response when impedances are mismatched in wiring connection of the present embodiment;

DESCRIPTION OF THE PREFERRED EMBODIMENTS

Figure 3:
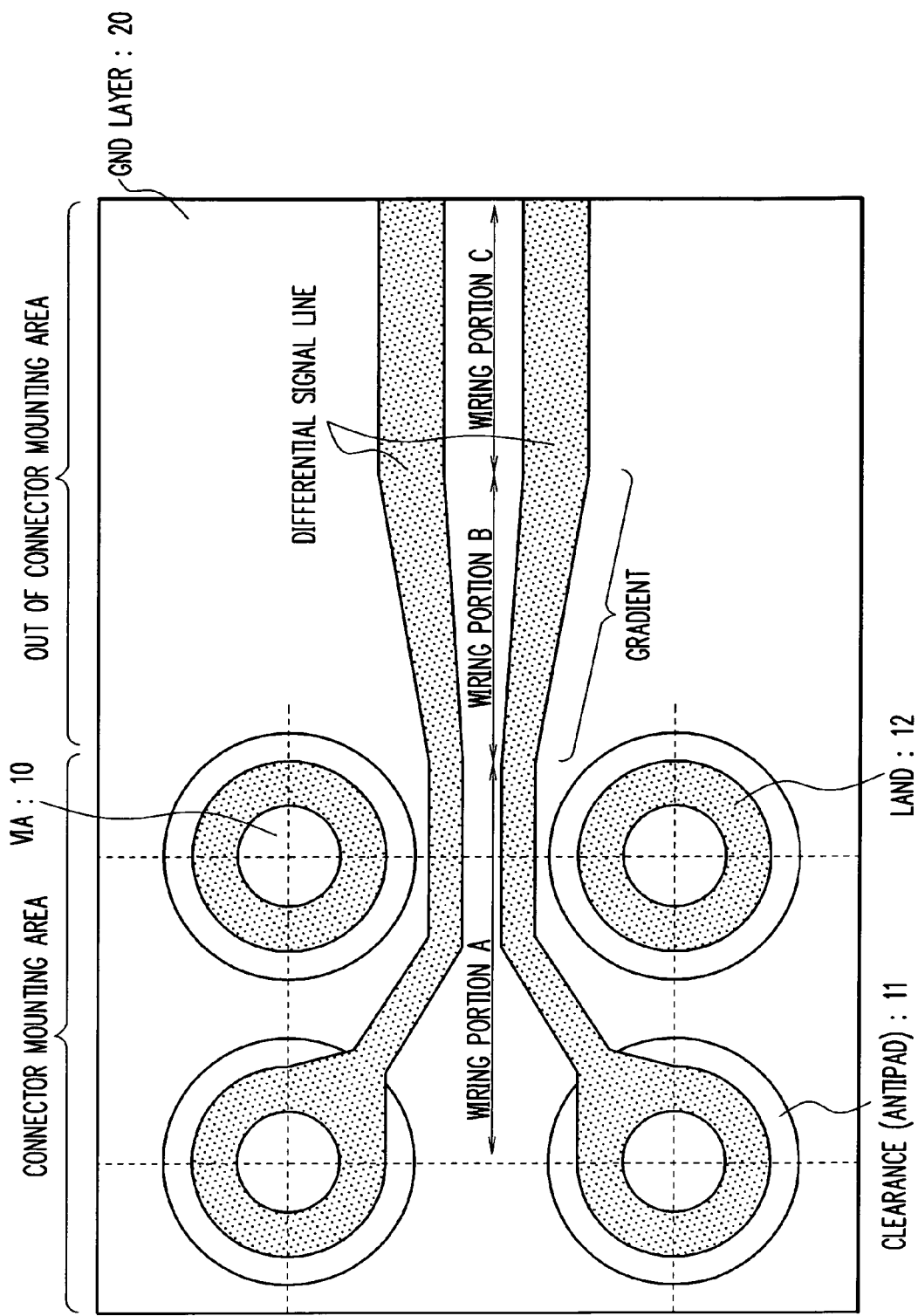
FIG. 3 is an illustration showing a configuration of a printed circuit board of the transmission line of the present embodiment.

A transmission line of this embodiment is first described by referring to FIG. 3. FIG. 3 shows a configuration of the transmission line of this embodiment.

As shown in FIG. 3, on a printed circuit board, the transmission line has a wiring portion (B) of a shape gradually increasing a line width and a line interval outside a connector mounting area where connectors are mounted and space for wiring is secured with difficulty so as to phase out the characteristic impedance of lines.

As shown in FIG. 3, a wiring portion (A) formed in a connector mounting area where connector mounting vias (10) are concentrated is designed so as to have a small wiring width. In this case, the wiring width is designed so that the characteristic impedance of the wiring becomes a desired value (generally, 50Ω for a single end line and 100Ω for a differential line).

Figure 1:
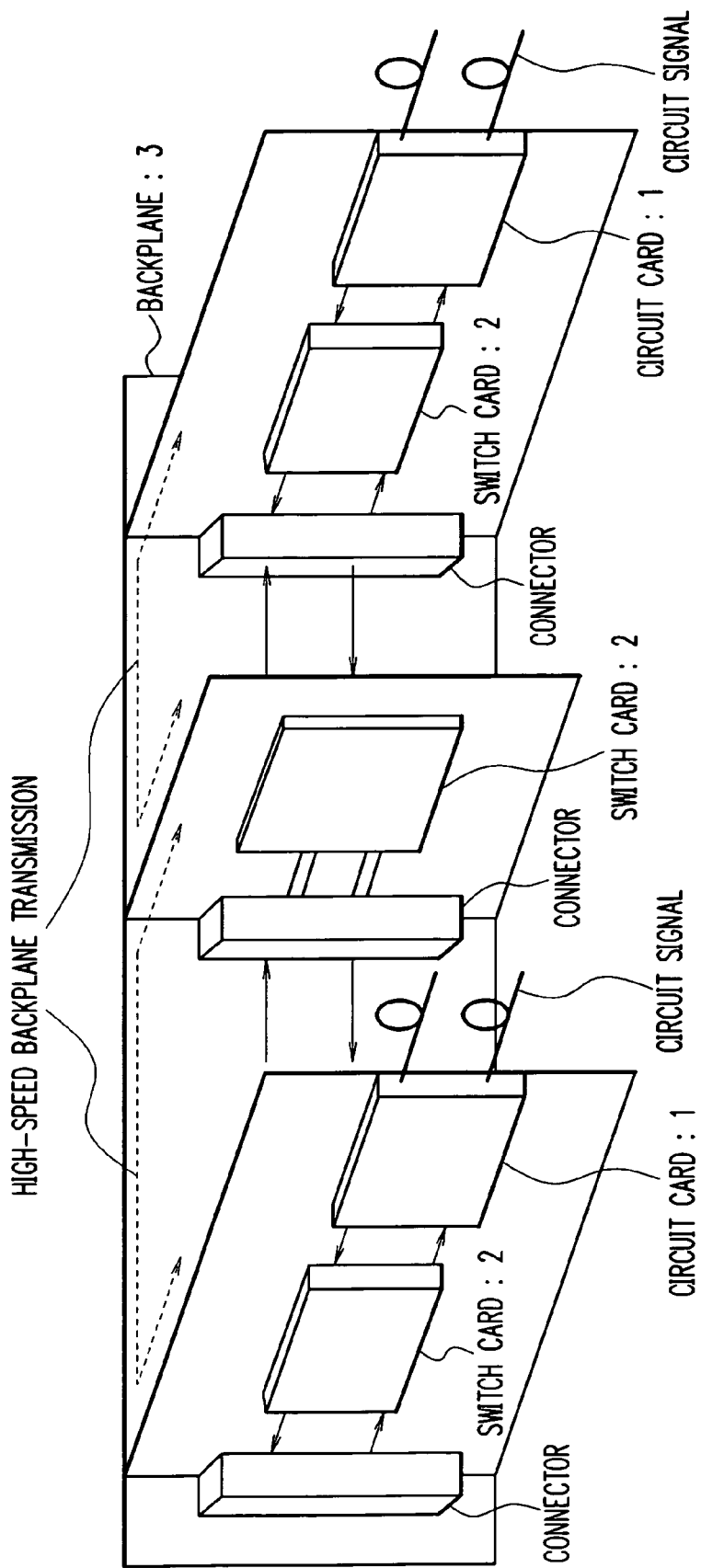
FIG. 1 is an illustration showing a schematic configuration of an IP switch router using a transmission line.
Figure 2:
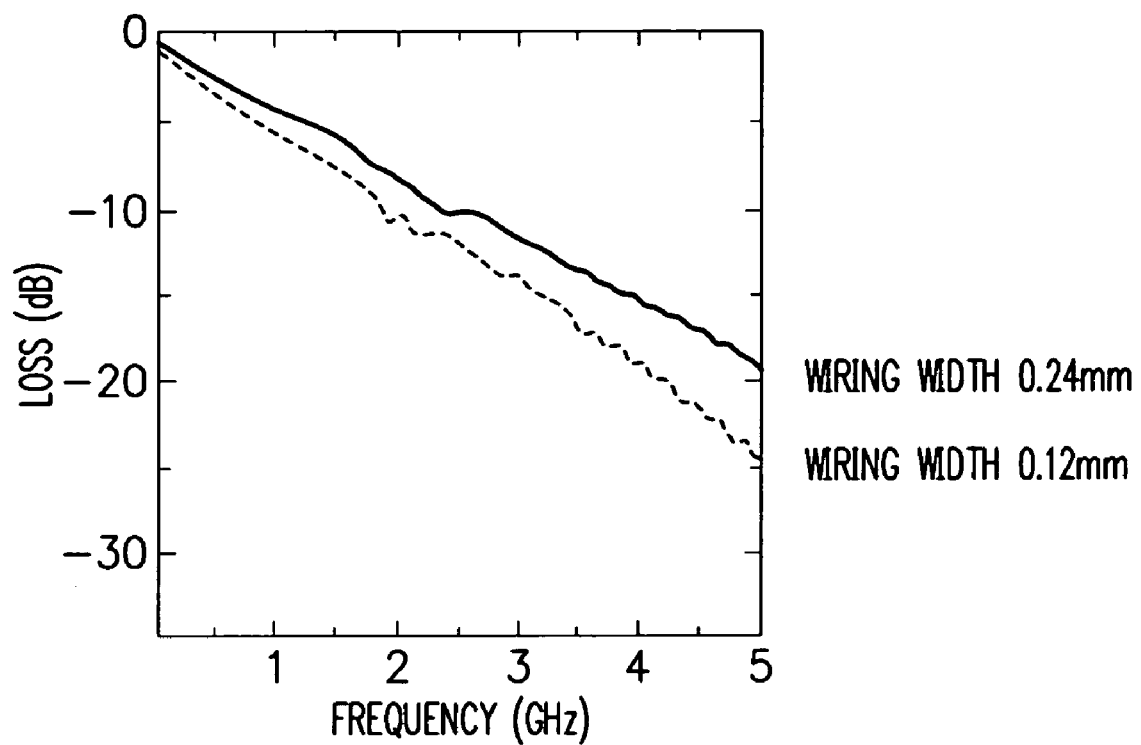
FIG. 2 is a graph showing attenuation values of signals due to difference between wiring widths.

Moreover, a wiring portion (C) formed in an area in which there is no connector mounting via (10) is designed to have a large wiring width so that the attenuation value of a signal is decreased. As shown in FIG. 2, it is possible to decrease the attenuation value of a signal by broadening the line width. However, when the line width is increased, the characteristic impedance of the line is lowered and signal's waveform deteriorates due to reflections.

In the case of a so-called hetero connection method for connecting two parts each having two different characteristic impedances such as a wiring portion (A) and a wiring portion (C), the waveform of the receiving end takes a shape as shown in the graph of FIG. 4. The graph in FIG. 4 shows pulse responses when wiring portions $Z_0$ and Zt having two different characteristic impedances are connected.

When wiring portions having two different characteristic impedances are connected, for example, when two wiring portions with characteristic impedances $Z_1$ and $Z_2$ are adjacent to each other and a pulse progresses from $Z_1$ to $Z_2$, a reflection coefficient r is given by $$r=(Z_2-Z_1)/(Z_2+Z_1). \quad (1)$$

As shown in the expression (1), when the value of $Z_1$ is very close to the value of $Z_2$, reflection does not occur but amplitudes of almost all pulses can transmit. That is, it is possible to transmit almost of all pulses by connecting the wiring portion (A) with the wiring portion (C) by the wiring portion (B) having the gradient of characteristic impedance so that the characteristic impedance changes gradually between the wiring portion (A) and the wiring portion (C) as shown in FIG. 3.

Therefore, in the case of the transmission line of this embodiment, it is possible to propagate amplitudes of almost all pulses from the wiring portion (A) to the wiring portion (C) through the wiring portion (B) by connecting the wiring portion (A) with the wiring portion (C) by the wiring portion (B) designed so as to have the gradient of characteristic impedance. FIG. 5 shows waveforms when a transmission line formed in accordance with the shape of the wiring portion shown in FIG. 3 is formed into a simple model and simulated. As a result of comparing waveforms of the graphs shown in FIGS. 4 and 5, it is found that the waveform shown in FIG. 5 obtains the maximum amplitude of a pulse at the rising edge of the pulse at the receiving end.

In the case of the transmission line of this embodiment, a signal from a connector terminal is sent to another connector terminal through a printed circuit board. The wiring pattern of the differential transmission line shown in FIG. 3 shows a wiring pattern of only one connector terminal. The transmission line of this embodiment has a wiring pattern as shown FIG. 6, where a wiring pattern axisymmetric to that of FIG. 3 is connected to the right end of the wiring pattern of FIG. 3 to form a differential transmission line of the wiring pattern shown in FIG. 6.

Figure 6:
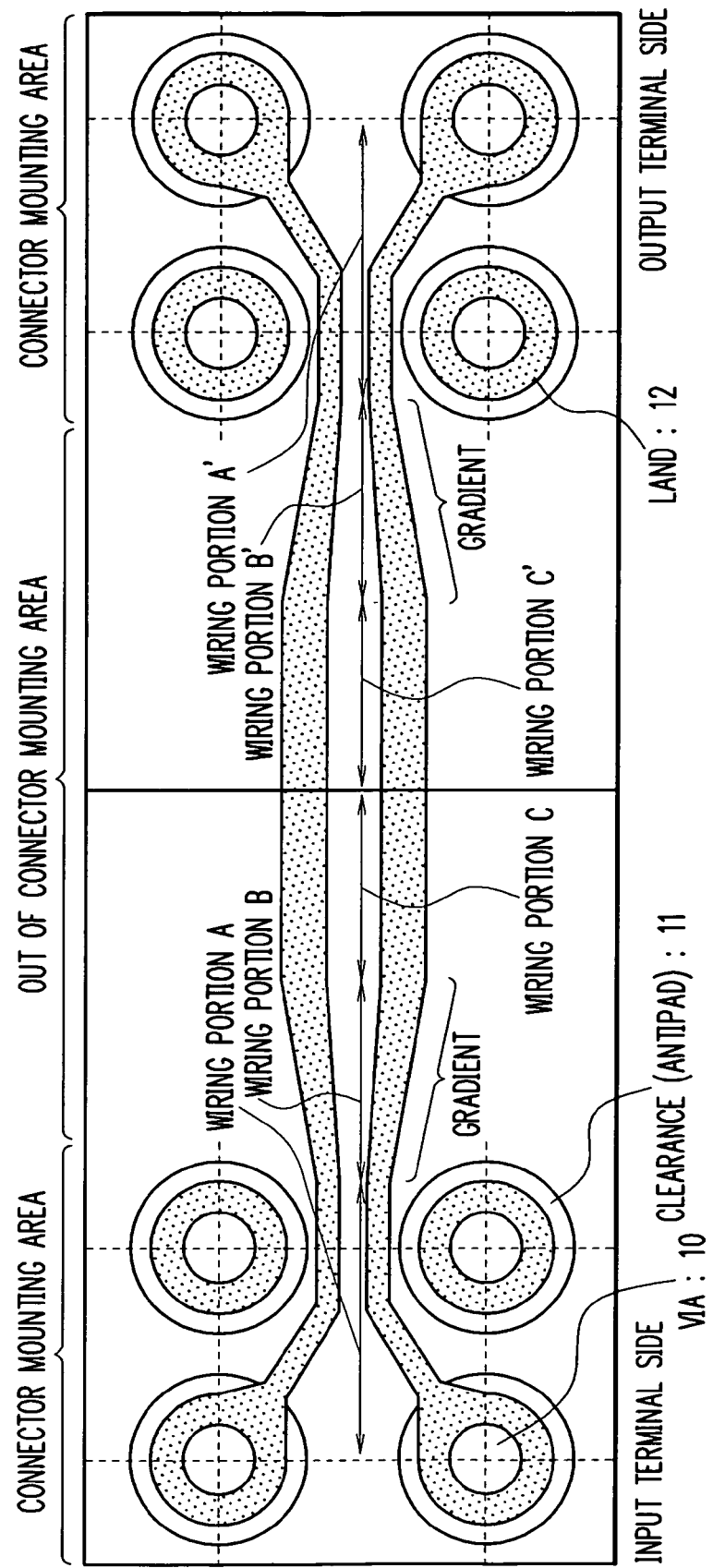
FIG. 6 is an illustration showing a configuration of a printed circuit board of the transmission line of the present embodiment.

Therefore, as shown in FIG. 6, the transmission line of this embodiment is a transmission line where the width of wiring portions (B and B') tapers. Outside a connector mounting area in which a connector is mounted, the line width of the wiring portion (B) and the line interval are gradually widened and the characteristic impedance of the wiring portion (B) is gradually decreased, and the line width of the wiring portion (B') and the interval between lines are gradually decreased and the characteristic impedance of the wiring portion (B') is gradually increased.

Thus, the transmission line of this embodiment is designed so as to gradually increase the line width and the interval between lines of the wiring portion (B), which is placed between the wiring portion (A) formed in a connector mounting area where connectors are mounted but wiring space is difficult to secure, and the wiring portion (C) formed outside the connector mounting area where space for wiring is easily secured. The transmission line forms a wiring pattern gradually decreasing the characteristic impedance of the wiring portion (B). Similarly, between the wiring portion (C') formed outside the connector mounting area where wiring space is easily secured and the wiring portion (A') formed in the connector mounting area where wiring space is difficult to secure, the wiring portion (B') is designed to gradually lessen the line width and the space between lines so that the characteristic impedance of the wiring portion (B') is gradually increased. Thereby, it is possible to construct a transmission line capable of absorbing reflections of signals caused by impedance mismatching, restraining the attenuation value of the signal, and performing preferable waveform transmission. The transmission line of this embodiment is described by referring to accompanying drawings. The transmission line of this embodiment realizes high-speed backplane transmission.

(Configuration of Transmission Line)

First, a configuration of the transmission line of this embodiment is described below by referring to FIG. 3. FIG. 3 shows a wiring pattern of a differential transmission line.

As shown in FIG. 3, the transmission line of this embodiment comprises a GND layer (20) where copper foil entirely covers a layer including a printed circuit board and a wiring layer (30) on which a linear copper pattern is formed.

The transmission line of this embodiment takes a microstrip line form or a strip line form with the GND layer (20) and wiring layer (30). As shown in FIG. 3, the wiring layer (30) forms a differential wiring pattern and provides a differential signal line.

Moreover, in the case of the transmission line of this embodiment, vias (10) for mounting connectors are formed on a printed circuit board and a land (12) on which a circular copper pattern is formed is set around each via (10). A clearance (antipad) (11) to be insulated from the GND layer (20) is formed around the land (12). Because the transmission line of this embodiment constitutes a microstrip line or strip line, the wiring layer (30) cannot be formed on the clearance (antipad) (11).

The transmission line of this embodiment connects signals from a connector terminal to another connector terminal through a printed circuit board. However, the wiring pattern of the differential transmission line shown in FIG. 3 shows a wiring pattern for some connector terminals. A whole wiring pattern can be seen in FIG. 6. In this figure, the left side is an input side and the right side is an output side.

The wiring patterns of the differential transmission line shown in FIGS. 3 and 6 are composed of three portions and wiring portions A and A', wiring portions B and B', and wiring portions C and C'. The wiring patterns shown in FIGS. 3 and 6 constitute a differential signal line by two wirings connected to the neighbor of the vias (10) in a connector mounting area in which a connector is mounted. The configuration of the differential transmission line shown in FIG. 6 is obtained by connecting the differential signal line shown in FIG. 3 with a figure axisymmetric to FIG. 3. Therefore, the configuration of the differential transmission line of this embodiment is described below by referring to FIG. 3.

The wiring portion (A) is a wiring pattern formed in the connector mounting area, which is formed by considering the interval between connectors and the shape of clearance (antipad) (11). Width of lines must be narrow. It is assumed that the electromagnetic connection between two lines is weak and ideally the characteristic impedance of the wiring portion (A) is equal to a desired impedance value. (For example, when the characteristic impedance of a single end is assumed to be $Z_0$, that of a differential transmission line is expected to be $2 \cdot Z_0$. Normally, the characteristic impedance is 50Ω for a single end line and 100Ω for a differential line.)

To obtain a desired impedance for satisfying the above conditions, the impedance can be calculated under conditions of wiring width of two lines, space between two lines, and thickness of an insulator. This is explained again later. Therefore, the line width and the space between lines need be extended as much as possible in a restricted area.

The wiring portion (C) is a wiring pattern formed outside the connector mounting area and it is possible to arbitrarily decide a line width in this area. Therefore, for the wiring portion (C), a line width is designed to be broader, a conductor resistance is smaller, and the attenuation value of a signal is smaller. Thus, the propagation distance can be lengthened.

Figure 7:
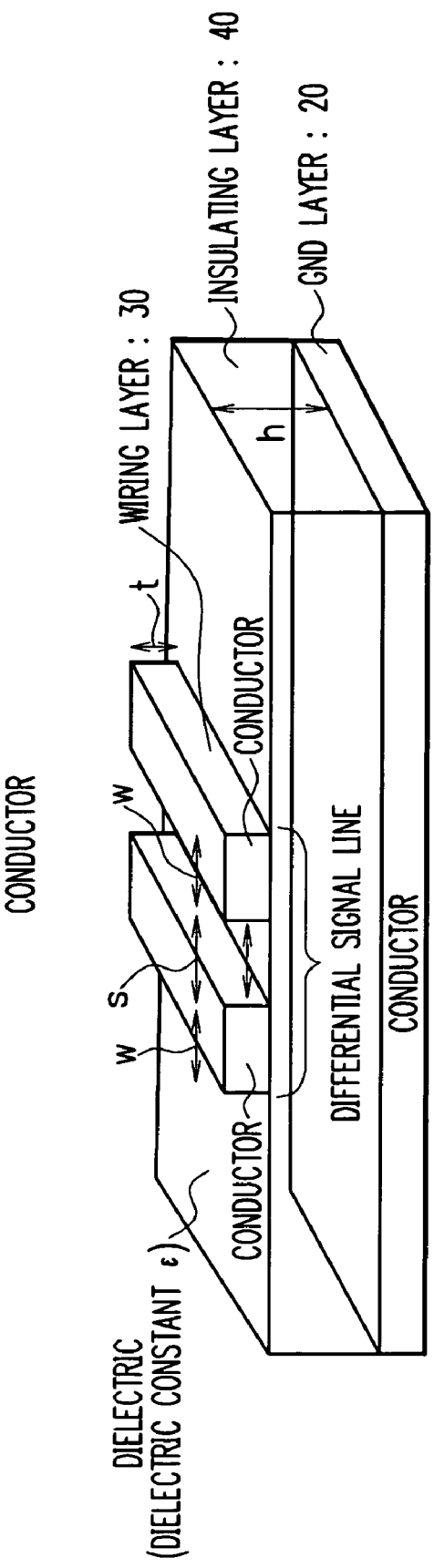
FIG. 7 is an illustration showing the sectional shape of the transmission line of the present embodiment and showing a configuration when the wiring pattern shown in FIG. 3 is applied to a microstrip line.

When applying the wiring pattern of the differential transmission line shown in FIG. 3 to a microstrip line, as shown in FIG. 7, the thickness of an insulating layer (40) formed between the GND layer (20) and the wiring layer (30) of the wiring portion (C) is constituted in the same condition as the thickness of the insulating layer (40) formed between the GND layer (20) of the wiring portion (A) and the wiring layer (30), and the characteristic impedance of the wiring portion (C) becomes smaller than the characteristic impedance of the wiring portion (A). This can be calculated in accordance with a calculation expression for the characteristic impedance of a microstrip line. FIG. 7 is an illustration showing a sectional configuration when the wiring pattern of the differential transmission line shown in FIG. 3 is applied to a microstrip line.

As shown in FIG. 7, the microstrip line includes the GND layer (20), the insulating layer (40), and the wiring layer (30). The wiring layer (30) constitutes an operating signal line in which a plurality of lines is formed. It is assumed that the line width on the wiring layer (30) is w, the line thickness is t, the interval between lines is s, the thickness of the insulating layer (40) is h, and the relative dielectric constant of the insulating layer (40) is ∈r.

Expression (2) gives a characteristic impedance $Z_0$ of the microstrip line shown in FIG. 7 and expression (3) gives a differential impedance $Z_{diff}$.

$$Z_0 = 60/\sqrt{(0.457 \in r + 0.67)} \cdot ln\{4h/0.67(0.8w+t)\} \quad (2)$$

$$Z_{diff} = 2 \cdot Z_0 \cdot \{1 - 0.48 \cdot exp(-0.96 \cdot s/h)\} \quad (3)$$

Figure 8:
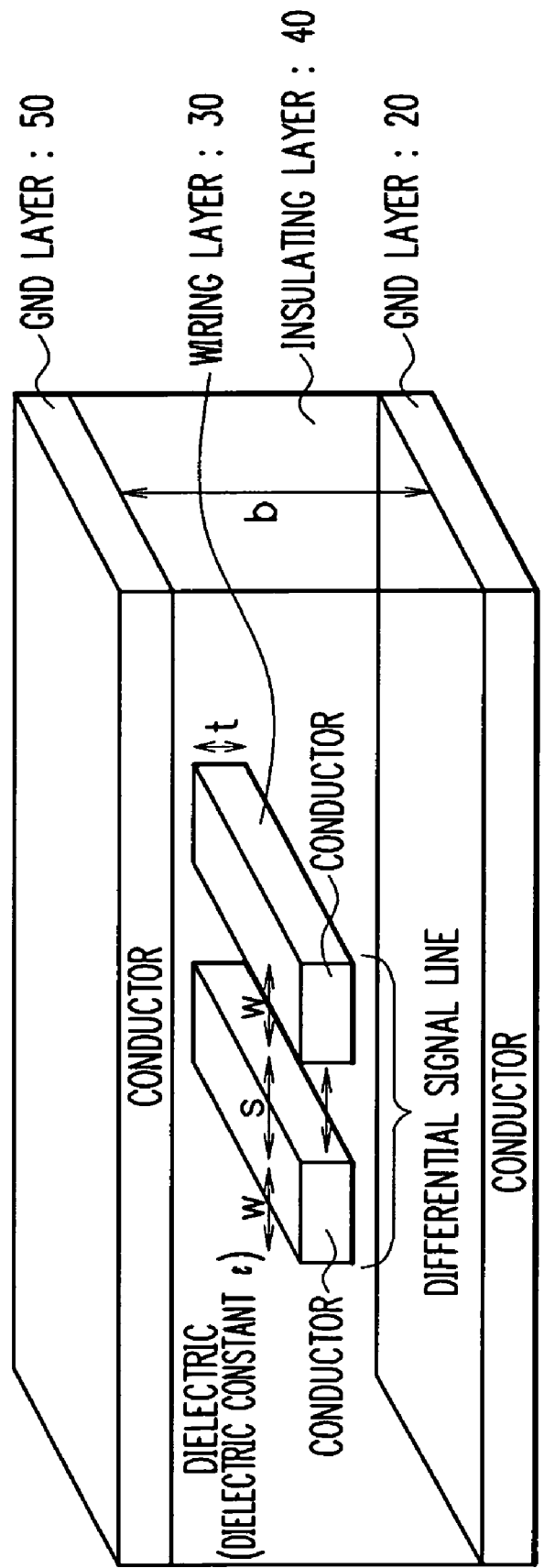
FIG. 8 is an illustration showing a sectional shape of the transmission line of the present embodiment and showing a configuration when the wiring pattern shown in FIG. 3 is applied to a strip line.

When the wiring pattern of the differential transmission line shown in FIG. 3 is applied to a strip line as shown in FIG. 8, the thickness of the insulating layer (40) formed between a first GND layer (20) and a second GND layer (50) of the wiring portion (C) is constituted in the same condition as the thickness of the insulating layer (40) formed between a first GND layer (20) and a second GND layer (50) of the wiring portion (A), and the characteristic impedance of the wiring portion (C) becomes smaller than the characteristic impedance of the wiring portion (A). This can be calculated in accordance with the calculation expression of the characteristic impedance of the strip line. FIG. 8 is an illustration showing a sectional configuration when the wiring pattern of the differential transmission line shown in FIG. 3 is applied to the strip line.

As shown in FIG. 8, the strip line comprises the first GND layer (20), insulating layer (40), wiring layer (30), and second GND layer (50). The wiring layer (30) constitutes an operating signal line provided with a plurality of lines. It is assumed that the line width on the wiring layer (30) is w, the line thickness is t, the line interval is s, the thickness of the insulating layer (40) is b, and the relative dielectric constant of the insulating layer (40) is ∈r.

Formula (4) gives a characteristic impedance $Z_0$ of the strip line shown in FIG. 8 and formula (5) gives a differential impedance $Z_{diff}$:

$$Z_0 = 60/\sqrt{(\in r)} \cdot ln\{4b/0.67(0.8w+t)\}; \quad (4)$$

$$Z_{diff} = 2 \cdot Z_0 \cdot \{1 - 0.374 \cdot exp(-0.29 \cdot s/b)\}.tm (5)$$

The wiring portion (B) is a wiring pattern formed in an area for connecting the wiring portions (A) and (C), which is designed so that a wiring width gradually increases from the wiring portion (A) toward the wiring portion (C), and the interval between lines gradually increases.

As shown in FIG. 3, the wiring portion (B) has the gradient of a characteristic impedance by forming the portion (B) in a wiring pattern designed so as to gradually increase the interval between lines and it is possible to equalize characteristic impedances of the wiring portions (A) and (C) at the boundary between the wiring portions (A) and (C).

Figure 9:
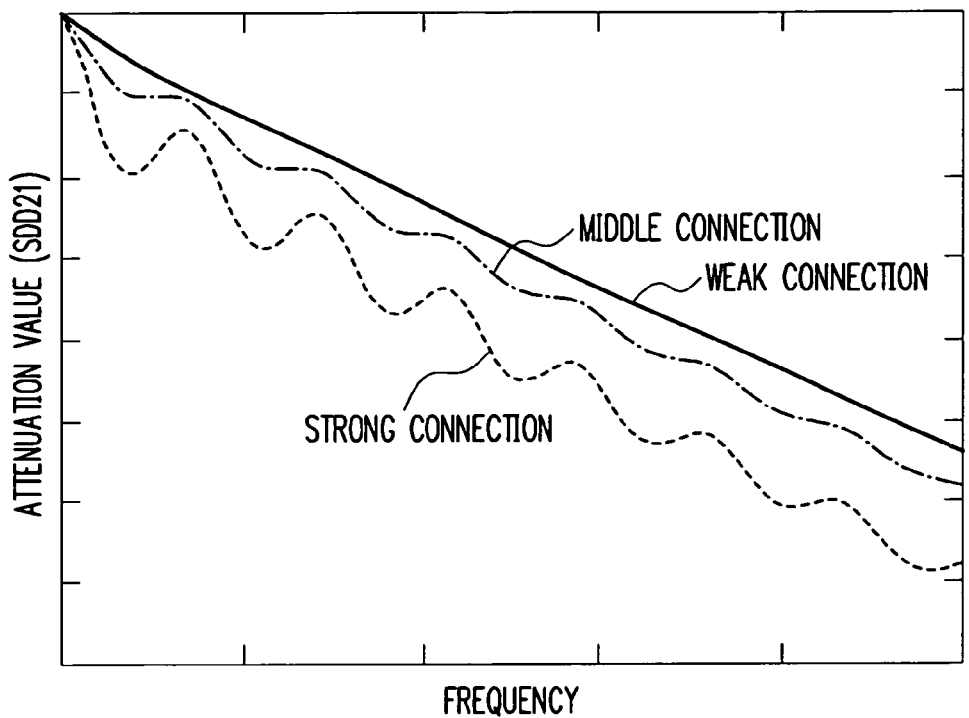
FIG. 9 is an illustration showing measurement results of simulating an attenuation characteristic by keeping the characteristic impedance $Z_{diff}$ of a differential line constant (100Ω) and changing the degree of coupling between two wirings.

Then, the electromagnetic connection at the wiring portions (A, B, and C) shown in FIG. 3 is described by referring to FIG. 9. FIG. 9 is a simulation result of attenuation characteristics by keeping the characteristic impedance $Z_{diff}$ of a differential line constant (100Ω) and changing the degree of coupling between two lines. The axis of abscissa shows frequency and the axis of ordinate shows attenuation value.

As a wiring condition, the wiring width w is fixed, the line interval s is adjusted, and the insulating layer thickness h or b is also adjusted so that a differential impedance is fixed. The higher the degree of two lines' coupling, the narrower the interval s and the thicker the thickness h or b.

As shown by the measurement results in FIG. 9, it is found that the attenuation value is larger as the electromagnetic connection between two lines gets stronger (strong connection), and the attenuation value is smaller as the electromagnetic connection between two lines is weaker (weak connection). Therefore, to decrease the attenuation value, it is preferable to decrease the electromagnetic connection between two lines.

Wiring patterns of the differential transmission line of this embodiment are described by referring to FIGS. 4 and 5. FIG. 4 shows pulse responses when transmission lines of two characteristic impedances are connected conventionally. FIG. 5 shows pulse responses of a model transmission line of this embodiment. In FIGS. 4 and 5, the broken line shows a waveform at a transmitting end and the continuous line shows a waveform at a receiving end.

In FIG. 4, a transmission line is constituted of three portions and characteristic impedances are connected in order of $Z_0$, $Z_t$, and $Z_0$. In this case, it is assumed that $Z_0$ is larger than $Z_t$.

In FIG. 5, it is assumed that the characteristic impedances are connected in order of $Z_0$, $Z_1$, $Z_2$, ..., $Z_n$, $Z_t$, $Z_n$, ..., $Z_2$, $Z_1$ where $Z_0 > Z_1 > Z_2 ... > Z_n > Z_t$. Because the waveform of a receiving end is important for normal signal transmission, it is allowed to ignore a transmitting end in this case.

When a pulse is propagated from the transmission line of the characteristic impedance $Z_1$ to the transmission line of the characteristic impedance $Z_2$, reflection of a signal occurs at the boundary between transmission lines and a waveform is deteriorated. FIG. 4 shows a waveform appearing at a receiving end and this corresponds to attenuation. Besides, because there are many high-frequency components at the rise of a signal, it is expected that the amplitude of a pulse be further decreased. However, in FIG. 5, it is possible to obtain the maximum amplitude at the rise of a signal. In FIG. 5, the influence of reflection remains after the rise of the signal but the decrease of amplitude is improved in comparison with the case of FIG. 4.

Figure 10:
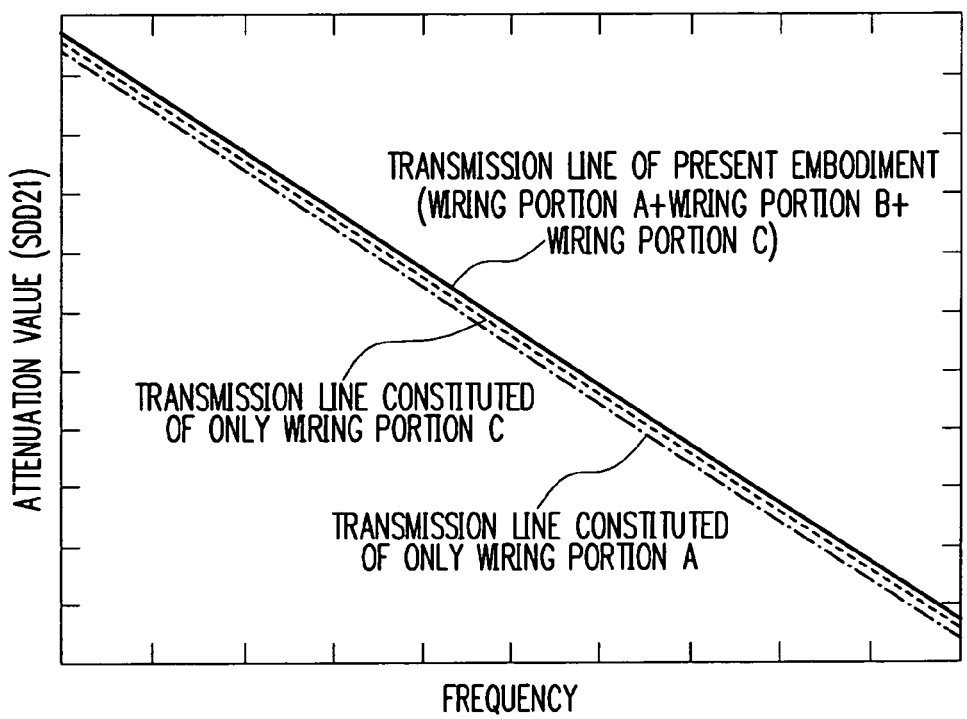
FIG. 10 is an illustration showing measurement results of simulating the attenuation characteristic of a transmission line comprising a wiring pattern according to a certain condition.

Then, the attenuation characteristic of the transmission line of this embodiment is described by referring to FIG. 10. FIG. 10 is an illustration showing a simulation result of the attenuation characteristic of transmission lines constituted of various wiring patterns: a wiring pattern connecting the wiring portions (A), (B), and (C) shown in FIG. 3; a transmission line constituted of only the wiring pattern of the wiring portion (A) shown in FIG. 3; and a transmission line constituted of only the wiring pattern of the wiring portion (C) shown in FIG. 3. The axis of abscissa shows frequency and the axis of ordinate shows attenuation value.

As shown by the measurement results in FIG. 10, because the transmission line constituted of only the wiring pattern of the wiring portion (A) has a small wiring width and a large conductor resistance, the attenuation value is maximized. Moreover, the transmission line constituted of only the wiring pattern of the wiring portion (C) has a large wiring width and a small conductor resistance. However, because characteristic impedances are mismatched, the attenuation value is slightly increased. The transmission line constituted of a wiring pattern connecting the wiring portions (A), (B), and (C) shown in FIG. 3 moderates the reflection caused by impedance mismatching by the wiring portion (B) having an impedance gradient and restrains the attenuation value of a signal. Therefore, the attenuation value is minimized.

Thus, in the case of the transmission line of this embodiment, a line width is designed to be narrow in an area (wiring portion A) where connectors are mounted and a wiring area is secured with difficulty, and a characteristic impedance is adjusted to a circuit. The line width is designed to be broad in an area (wiring portion C) where a wiring area is easily secured, and the attenuation value of a signal is designed to be minimized. Moreover, the area (wiring portion B) between wiring portion A and wiring portion C is formed of a wiring pattern having an impedance gradient. Thereby, it is possible to construct a transmission line capable of restraining the attenuation value of a signal and absorbing the reflection caused by impedance mismatching.

Therefore, the transmission line of this embodiment makes it possible to increase a wiring width and decrease the attenuation value of a signal even if connector terminals are densely accumulated. This means a long wiring design and shows that a wiring can be flexibly designed in product development. Moreover, even if a wiring width is increased, it is possible to restrain the thickness of a substrate. Therefore, it is possible to flexibly fabricate a substrate.

(Second embodiment)

Then, a second embodiment is described.

The transmission line of the first embodiment is designed so as to gradually increase a wiring width like the wiring portion (B) shown in FIG. 3 in order to hold a characteristic impedance gradient. However, for the transmission line of the second embodiment, a characteristic impedance gradient to the wiring width of the wiring portion (B) is optimized by using the expressions (2) and (3) in the case of the microstrip line shown in FIG. 7 and by using the expressions (4) and (5) in the case of the strip line shown in FIG. 8.

Thus, the transmission line of the second embodiment optimizes the characteristic impedance of a wiring in accordance with the line width w, the line interval s, the thickness t of a wiring layer, the thickness h of an insulating layer, and relative dielectric constant ∈r of an insulating layer in the case of the microstrip ling shown in FIG. 7, and the characteristic impedance of a wiring is optimized in accordance with a wiring width w, the line interval s, thickness t of a wiring layer, thickness b of an insulating layer, and relative dielectric constant ∈r of an insulating layer in the case of the strip line shown in FIG. 8. Thereby, it is possible to construct a transmission line capable of further restraining the attenuation value of a signal and absorbing the reflection caused by impedance mismatching.

The above embodiment is an embodiment suitable for the present invention but the present invention is not restricted to only the above embodiment. Various modifications of the present invention can be executed as long as they are not deviated from the gist of the present invention.

A transmission line and a wiring forming method of the present invention can be applied to high-speed-transmission communication units such as switching and routers.

What is claimed is:

1. A transmission line comprising:
    a plurality of tapered lines,
    wherein outside a wiring area where space for wiring is difficult to secure, the lines are designed so that a line width and a line interval are gradually increased and characteristic impedances of the lines are gradually decreased from a characteristic impedance of a source, and
    the lines are also designed so that the line width and the line interval are gradually decreased and characteristic impedances of the lines are gradually increased to match a characteristic impedance of a load.

2. The transmission line according to claim 1, wherein lines whose characteristic impedance is gradually decreased are formed at the input terminal side, and lines whose characteristic impedance is gradually increased are formed at the output terminal side.

3. The transmission line according to claim 1, wherein lines are designed so that the electromagnetic connection between the lines becomes weak.

4. The transmission line according to claim 1, wherein connectors are set in a wiring area where space for wiring is difficult to secure.

5. The transmission line according to claim 1, wherein a differential signal line is formed by such a wiring design.

6. The transmission line according to claim 1, wherein a wiring is designed so that the line width is broadened in a wiring area where space for wiring is easily secured.

7. The transmission line according to claim 6, wherein
    a line whose characteristic impedance is gradually decreased is formed from a wiring in an area where space for wiring is difficult to secure toward a wiring in a wiring area where space for wiring is easily secured, and
    a line whose characteristic impedance is gradually increased is formed from the wiring in the wiring area where space for wiring is easily secured toward the wiring in the wiring area where space for wiring is difficult to secure.

8. The transmission line according to claim 1, wherein
    the transmission line is a microstrip line,
    the transmission line has a GND layer, an insulating layer formed on the GND layer, and a wiring layer on which the wiring is formed, and
    the wiring layer is formed on the insulating layer.

9. The transmission line according to claim 8, wherein wiring is formed which optimizes the characteristic impedance of the wiring in accordance with a line width, a line interval, a thickness of the wiring layer, a thickness of the insulating layer, and relative dielectric constant of the insulating layer.

10. The transmission line according to claim 1, wherein
    the transmission line is a strip line,
    the transmission line has a GND layer, an insulating layer formed on the GND layer, and a wiring layer on which the wiring is formed, and
    the wiring layer is embedded in the insulating layer.

11. The transmission line according to claim 10, wherein wiring is formed which optimizes the characteristic impedance of the wiring in accordance with a line width, a line interval, a thickness of the wiring layer, a thickness of the insulating layer, and relative dielectric constant of the insulating layer.

12. A wiring forming method for forming tapered lines on a printed circuit board, wherein wiring is designed so that a line width and a line interval are gradually increased and the characteristic impedance of the lines is gradually decreased from a characteristic impedance of a source in an area outside a wiring area where space for wiring is difficult to secure, and wiring is designed so that the line width and the line interval are gradually decreased and the characteristic impedance of the wiring is gradually increased on the printed circuit board to match a characteristic impedance of a load.

13. The wiring forming method according to claim 12, wherein the lines whose characteristic impedance is gradually decreased is formed at the input terminal side of the printed circuit board and the lines whose characteristic impedance is gradually increased is formed at the output terminal side of the printed circuit board.

14. The wiring forming method according to claim 12, wherein the wiring is designed on the printed circuit board so that the electromagnetic connection between lines becomes weak.

15. The wiring forming method according to claim 12, wherein a differential signal line is formed on the printed circuit board by such a wiring design.

16. The wiring forming method according to claim 12, wherein a wiring designed so that a line width is increased in a wiring area where space for wiring is easily secured is formed on the printed circuit board.

17. The wiring forming method according to claim 16, wherein the lines whose characteristic impedance is gradually decreased is formed from a wiring in a wiring area where space for wiring is difficult to secure toward a wiring in a wiring area where space for wiring is easily secured, and the lines whose characteristic impedance is gradually increased is formed from a wiring in a wiring area where space for wiring is easily secured toward a wiring in a wiring area where space for wiring is difficult to secure.

18. The wiring forming method according to claim 12, wherein a microstrip line is constituted by forming the wiring on the printed circuit board, and the microstrip line comprises a GND layer, an insulting layer formed on the GND layer, and a wiring layer on which the wiring is formed, and the wiring layer is formed on the insulating layer.

19. The wiring forming method according to claim 18, wherein a wiring optimizing the characteristic impedance of the lines in accordance with a line width, a line interval, a thickness of the wiring layer, a thickness of the insulating layer, and relative dielectric constant of the insulating layer is formed on the printed circuit board.

20. The wiring forming method according to claim 12, wherein a strip line is constituted by forming the wiring on the printed circuit board, the strip line comprises a GND layer, an insulating layer formed on the GND layer, and wiring layer on which the wiring is formed, and the wiring layer is embedded in the insulating layer.

21. The wiring forming method according to claim 20, wherein a wiring optimizing the characteristic impedance of the lines in accordance with a line width, a line interval, a thickness of the wiring layer, a thickness of the insulating layer, and relative dielectric constant of the insulating layer is formed on the printed circuit board.

* * * * *